United States Patent
Hundley

(10) Patent No.: US 11,411,578 B1
(45) Date of Patent: Aug. 9, 2022

(54) BIT REORDERING COMPRESSION

(71) Applicant: Teradata US, Inc., Dayton, OH (US)

(72) Inventor: Douglas E. Hundley, Poway, CA (US)

(73) Assignee: Teradata US, Inc., San Diego, CA (US)

( * ) Notice: Subject to any disclaimer, the term of this patent is extended or adjusted under 35 U.S.C. 154(b) by 669 days.

(21) Appl. No.: 16/236,635

(22) Filed: Dec. 30, 2018

Related U.S. Application Data

(60) Provisional application No. 62/612,586, filed on Dec. 31, 2017.

(51) Int. Cl.
| | | |
|---|---|---|
| G06F 16/00 | (2019.01) | |
| H03M 7/46 | (2006.01) | |
| G06F 3/06 | (2006.01) | |
| G06F 16/21 | (2019.01) | |
| G06F 16/28 | (2019.01) | |

(52) U.S. Cl.
CPC .......... *H03M 7/46* (2013.01); *G06F 3/0608* (2013.01); *G06F 3/0661* (2013.01); *G06F 3/0673* (2013.01); *G06F 16/21* (2019.01); *G06F 16/284* (2019.01)

(58) Field of Classification Search
None
See application file for complete search history.

(56) References Cited

U.S. PATENT DOCUMENTS

| | | | | |
|---|---|---|---|---|
| 7,383,270 B1* | 6/2008 | Kostamaa | ............... | H03M 7/30 707/693 |
| 8,407,239 B2* | 3/2013 | Dean | ..................... | G06F 16/951 707/764 |
| 8,738,632 B2* | 5/2014 | Bestgen | .............. | G06F 16/2237 707/744 |
| 8,832,112 B2* | 9/2014 | Bestgen | .............. | G06F 16/2237 707/744 |
| 9,720,927 B2* | 8/2017 | Mohapatra | .......... | G06F 16/2228 |
| 9,798,727 B2* | 10/2017 | Dickie | .................. | G06F 16/122 |
| 10,394,848 B2* | 8/2019 | Gupta | ..................... | G06F 16/22 |

* cited by examiner

*Primary Examiner* — Debbie M Le
(74) *Attorney, Agent, or Firm* — Randy L. Campbell, Jr.

(57) ABSTRACT

A data store system may include a storage device configured to store a plurality of data store tables. The data store system a further include a processor in communication with the storage device. The processor may receive a request to encode a column of a data store table from the plurality of data store tables. The processor may further generate a bit value representation of each value in the column of the data store table. The processor may further generate an index. The index may include an index value representative of each bit position of the bit value representations. The processor may further reorder bits of each bit value representation according to a predetermined pattern. The processor may further encode each reordered bit value representation according to an encoding technique. The processor may further store each encoded reordered bit value representations and the index. A method and computer-readable medium are also disclosed.

20 Claims, 6 Drawing Sheets

BIT REORDERING COMPRESSION

CLAIM OF PRIORITY

This application claims the benefit of priority under 35 U.S.C. § 119(e) of U.S. Provisional Patent Application Ser. No. 62/612,586 filed on Dec. 31, 2017, which is hereby incorporated by reference herein in its entirety.

BACKGROUND

As the amount of useful data to be stored in various data stores grows, optimizing data storage through various encoding/compression techniques is desired. One such encoding technique is Golomb-Rice encoding. Golomb-Rice encoding involves both Golomb coding and Rice coding techniques. Golomb coding involves a family of data compression codes. Alphabets that follow a geometric distribution are extremely suitable for having a Golomb code as an optimal prefix code. Rice coding uses a subset of a family of Golomb codes to generate simpler, and sometimes suboptimal, prefix codes. Golomb coding uses a tunable parameter A to divide an input value N into two parts: 1. Q, which is the resultant value of a division of the input value by M; and 2. The remainder R. The quotient is encoded in unary encoding and the remainder R is encoded in truncated binary encoding.

Many datasets with large alphabets (such as an array of integers) do not have a geometric distribution of its contents. When Golomb-Rice coding is used to compress the dataset, the results are suboptimal. Many methods have been created and deployed to transform integer datasets in conjunction with Golomb-Rice coding for improved lossless compression. One example is broadly called the Integer Wavelet Transform (IWT). Various forms of IWT are being used today for the compression of audio and video. IWTs are complex and CPU intensive and are useful on a narrow range of datasets. Other transforms exist and also operate well on a narrow range of datasets. It is desirable to transform non-geometrically distributed datasets such that they often be more optimized for subsequent Golomb-Rice coding.

SUMMARY

According to one aspect of the disclosure, a data store system may include a storage device configured to store a plurality of data store tables. The data store system may further include a processor in communication with the storage device. The processor may receive a request to encode a column of a data store table from the plurality of data store tables. The processor may further generate a bit value representation of each value in the column of the data store table. The processor may further generate an index. The index may include an index value representative of each bit position of the bit value representations. The processor may further reorder bits of each bit value representation according to a predetermined pattern. The processor may further encode each reordered bit value representation according to an encoding technique. The processor may further store each encoded reordered bit value representations and the index.

According to another aspect of the disclosure, a method may include receiving, with a processor, a request to encode a column of a data store table from a plurality of data store tables stored in a storage device. The method may further include generating, with the processor, a bit value representation of each value in the column of the data store table. The method may further include generating, with the processor, an index, wherein the index comprises an index value representative of each bit position of the bit value representations. The method may further include reordering, with the processor, bits of each bit value representation according to a predetermined pattern. The method may further include encoding, with the processor, each reordered bit value representation according to an encoding technique. The method may further include storing, with the processor, each encoded reordered bit value representations and the index.

According to another aspect of the disclosure, a computer-readable medium may be encoded with a plurality of instructions executable by a processor. The plurality of instructions may include instructions to receive a request to encode a column of a data store table from a plurality of data store tables stored in a storage device. The plurality of instructions may further include instructions to generate a bit value representation of each value in the column of the data store table. The plurality of instructions may further include instructions to generate an index, wherein the index comprises an index value representative of each bit position of the bit value representations. The plurality of instructions may further include instructions to reorder bits of each bit value representation ding to a predetermined pattern. The plurality of instructions may further include instructions to encode each reordered bit value representation according to an encoding technique. The plurality of instructions may further include instructions to store each encoded reordered bit value representations and the index.

BRIEF DESCRIPTION OF THE DRAWINGS

The present disclosure may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE FIGURES

Figure 1:
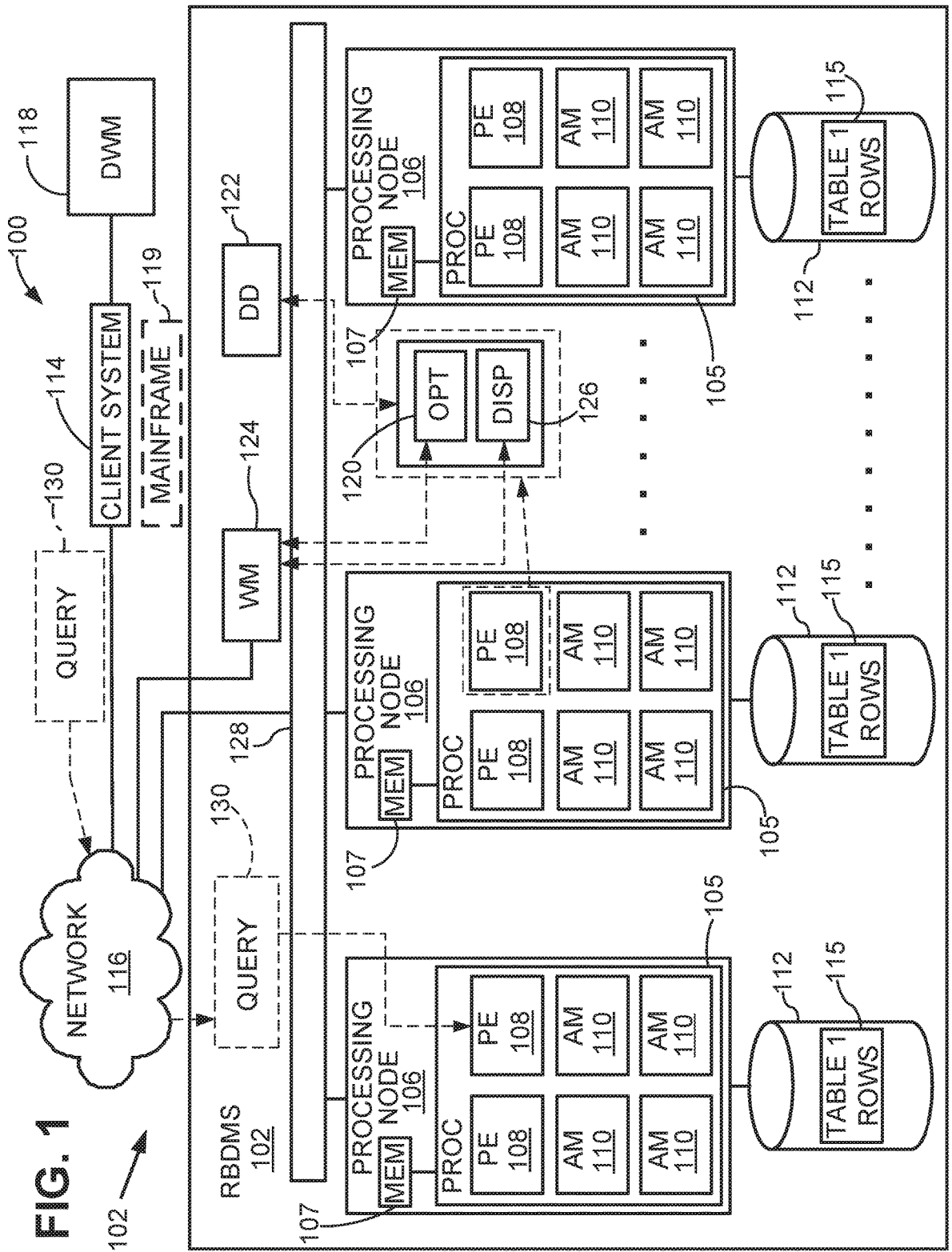
FIG. 1 is a block diagram of an example database system.

FIG. 1 is a diagrammatic representation of example architecture for a database system 100. In one example, the database system 100 includes a relational database management system (RDBMS) 102 that implements a parallel-processing environment to carry out database management. The RDBMS 102 may be a combination of software (e.g., computer program routines, subroutines, applications, etc.) and hardware (e.g., processors, memory, etc.). In the example of FIG. 1, the RDBMS 102 may be a massive parallel processing (MPP) system having an array of processing units and distributed memory. In alternative examples, the RDBMS 102 may implement a single processing unit, such as in a symmetric multiprocessing (SMP) system configuration. The RDBMS 102 may include one or more processing units used to manage the storage, retrieval, and manipulation of data in data storage facilities (DSFs) 112. The array of processing units may include an array of processing nodes 106 that manage the storage, retrieval, and manipulation of data included in a database.

In one example, each processing node 106 may include one or more physical processors 105 and memory 107. The memory 107 may include one or more memories and may be computer-readable storage media or memories, such as a cache, buffer, RAM, removable media, hard drive, flash drive or other computer-readable storage media. Computer-readable storage media may include various types of volatile and nonvolatile storage media. Various processing techniques may be implemented by the processors 105 such as multiprocessing, multitasking, parallel processing and the like, for example.

The processing nodes 106 may include one or more other processing unit arrays such as parsing engine (PE) modules 108 and access modules (AM) 110. As described herein, each module, such as the parsing engine modules 108 and access modules 110, may be hardware or a combination of hardware and software. For example, each module may include an application specific integrated circuit (ASIC), a Field. Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 107, for example, that comprises instructions executable with the processor 105 or other processor to implement one or more of the features of the module. When any one of the modules includes the portion of the memory that comprises instructions executable with the processor, the module may or may not include the processor. In some examples, each module may just be the portion of the memory 107 or other physical memory that comprises instructions executable with the processor 105 or other processor to implement the features of the corresponding module without the module including any other hardware. Because each module includes at least some hardware even when the included hardware comprises software, each module may be interchangeably referred to as a hardware module, such as the parsing engine hardware module or the access hardware module. The access modules 110 may be access modules processors (AMPs), such as those implemented in the Teradata Active Data Warehousing System®.

The parsing engine modules 108 and the access modules 110 may each be virtual processors (vprocs) and/or physical processors. In the case of virtual processors, the parsing engine modules 108 and access modules 110 may be executed by one or more physical processors, such as those that may be included in the processing nodes 106. For example, in FIG. 1, each parsing engine module 108 and access module 110 is associated with a respective processing node 106 and may each be executed as one or more virtual processors by physical processors 107 included in the respective processing node 106.

In FIG. 1, each processing node 106 is shown as including multiple parsing engine modules 108 and access modules 110, such that there are more parsing engine modules 108 and access modules 110 than processing nodes 106. In one example, during operation, the one or more physical processors 105 included in the processing nodes 106 may execute the parsing engine modules 108 and access modules 110 by switching between the executions of the various modules at a rapid rate allowing the vprocs to substantially operate in "parallel."

The RDBMS 102 stores data in one or more tables in the DSFs 112. In one example, rows 115 of a table, "Table 1," are distributed across the DSFs 112 and in accordance with their primary index. The primary index defines the columns of the rows that are used for calculating a hash value. The function that produces the hash value from the values in the columns specified by the primary index is called the hash function. Some portion, possibly the entirety, of the hash value is designated a "hash bucket." The hash buckets are assigned to DSFs 112 and associated access modules 110 by a hash bucket map. The characteristics of the columns chosen for the primary index determine how evenly the rows are distributed.

Rows of each stored table may be stored across multiple DSFs 112. Each parsing engine module 108 may organize the storage of data and the distribution of table rows. The parsing engine modules 108 may also coordinate the retrieval of data from the DSFs 112 in response to queries received, such as those received from a client computer system 114 connected to the RDBMS 102 through connection with a network 116. The network 116 may be wired, wireless, or some combination thereof. The network 116 may be a virtual private network, web-based, directly-connected, or some other suitable network configuration. In one example, the client computer system 114 may run a dynamic workload manager (DWM) client 118. Alternatively, the database system 100 may include a mainframe 119 used to interact with the RDBMS 102.

Each parsing engine module 108, upon receiving an incoming database query, such as the query 130, may apply an optimizer module 120 to assess the best plan for execution of the query. An example of an optimizer module 120 is shown in FIG. 1 with regard to parsing engine module 108. Additional description of the parsing engine modules 108 is provided with regard to FIGS. 2 and 3. Selecting the optimal query-execution plan may include, among other things, identifying which of the processing nodes 106 are involved in executing the query and which database tables are involved in the query, as well as choosing which data-manipulation techniques will serve best in satisfying the conditions of the query. To this end, for each parsing engine module 108, a parser module 202 (see FIG. 2), and/or optimizer module 120 may access a data dictionary module 122, shown in FIG. 1 specifically for parsing engine module 108 for purposes of illustration.

The data dictionary module 122 may specify the organization, contents, and conventions of one or more databases, such as the names and descriptions of various tables maintained by the RDBMS 102 as well as fields of each database, for example. Further, the data dictionary module 122 may specify the type, length, and/or other various characteristics of the stored tables. The RDBMS 102 typically receives queries in a standard format, such as the structured query language (SQL) put forth by the American National Standards Institute (ANSI). However, other formats, such as contextual query language (CQL), data mining extensions (DMX), and multidimensional expressions (MUX), for example, may be implemented in the database system 100 separately or in conjunction with SQL. The data dictionary may be stored in the DSFs 112 or some other storage device and selectively accessed.

The RDBMS 102 may include a workload management (WM) module 124, which in one example may be Teradata Active System Management. The WM module 124 may be implemented as a "closed-loop" system management (CLSM) architecture capable of satisfying a set of workload-specific goals. In other words, the RDBMS 102 is a goal-oriented workload management system capable of supporting complex workloads and capable of self-adjusting to various types of workloads. The WM module 124 may communicate with each optimizer module 120, as shown in FIG. 1, and is adapted to convey a confidence threshold parameter and associated parameters to the optimizer module 120 in communication. Further, the WM module 124 may communicate with a dispatcher module 126 of each parsing engine module 108 (as shown in detail FIG. 1 for parsing engine module 108) to receive query execution plan costs therefrom, and to facilitate query exception monitoring and automated modifications of confidence threshold parameters in accordance with disclosed embodiments. The DWM client 118 may communicate with the WM module 124 via the network 116.

The WM module 124 operation has four major phases: 1) assigning a set of incoming request characteristics to workload groups, assigning the workload groups to priority classes, and assigning goals (referred to as Service Level Goals or SLGs) to the workload groups; 2) monitoring the execution of the workload groups against their goals; 3) regulating (e.g., adjusting and managing) the workload flow and priorities to achieve the SLGs; and 4) correlating the results of the workload and taking action to improve performance. In accordance with disclosed embodiments, the WM module 124 is adapted to facilitate control of the optimizer module 120 pursuit of robustness with regard to workloads or queries.

An interconnection 128 allows communication to occur within and between each processing node 106. For example, implementation of the interconnection 128 provides media within and between each processing node 106 allowing communication among the various processing units. Such communication among the processing units may include communication between parsing engine modules 108 associated with the same or different processing nodes 106, as well as communication between the parsing engine modules 108 and the access modules 110 associated with the same or different processing nodes 106. Through the interconnection 128, the access modules 110 may also communicate with one another within the same associated processing node 106 or other processing nodes 106.

The interconnection 128 may be hardware, software, or some combination thereof. In instances of at least a partial-hardware implementation the interconnection 128; the hardware may exist separately from any hardware e.g, processors, memory, physical wires, etc.) included in the processing nodes 106 or may use hardware common to the processing nodes 106. In instances of at least a partial-software implementation of the interconnection 128, the software may be stored and executed on one or more of the memories 107 and processors 105 of the processing nodes 106 or may be stored and executed on separate memories and processors that are in communication with the processing nodes 106. In one example, interconnection 128 may include multi-channel media such that if one channel ceases to properly function, another channel may be used. Additionally or alternatively, more than one channel may also allow distributed communication to reduce the possibility of an undesired level of communication congestion among processing nodes 106.

Figure 2:
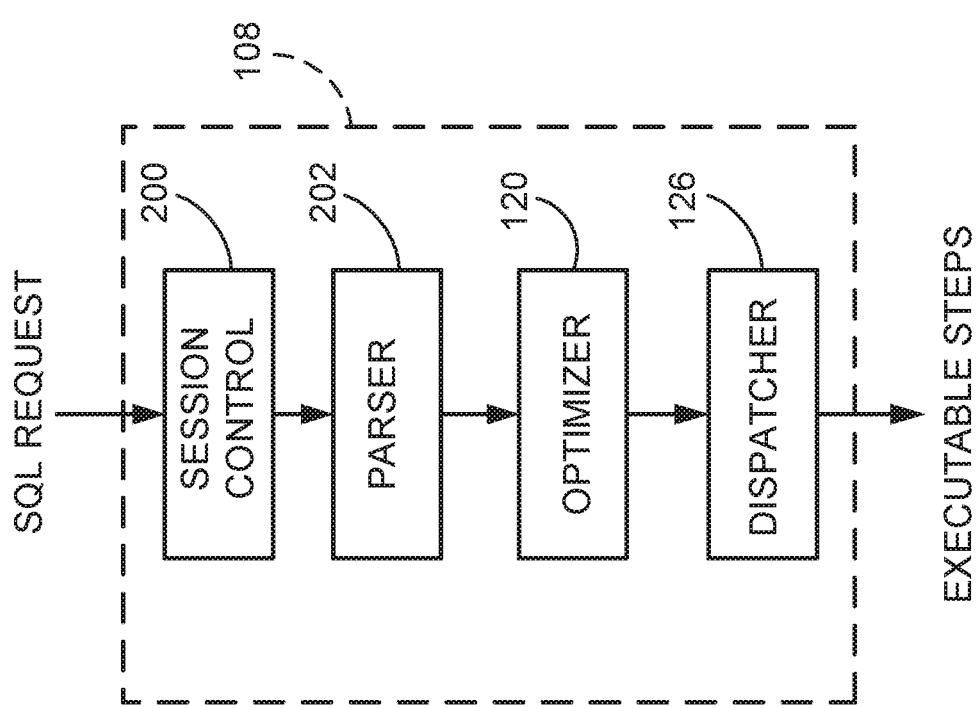
FIG. 2 is a block diagram of a portion of the example database system of FIG. 1.

In one example system, each parsing engine module 108 includes three primary components: a session control module 200, a parser module 202, and a dispatcher module 126 as shown in FIG. 2. The session control module 200 provides the logon and logoff functions. It accepts a request for authorization to access the database, verifies it, and then either allows or disallows the access. Once the session control module 200 allows a session to begin, an SQL request may be received such as through submission by a user and the SQL request is routed to the parser module 202.

Figure 3:
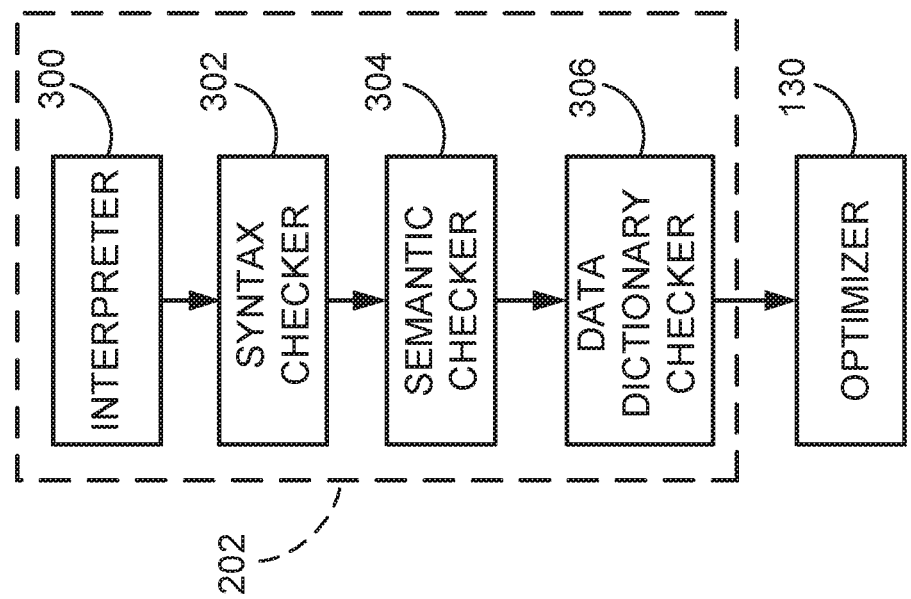
FIG. 3 is a block diagram of another portion of the example database system of FIG. 1.

As illustrated in FIG. 3, the parser module 202 may include an interpreter module 300 that interprets the SQL request. The parser module 202 may also include a syntax checker module 302 that checks the request for correct SQL syntax, as well as a semantic checker module 304 that evaluates the request semantically. The parser module 202 may additionally, include a data dictionary checker 306 to ensure that all of the objects specified in the SQL request exist and that the user has the authority to perform the request. The parsing engine module 108 implements the optimizer module 120 to select the least expensive plan to perform the request, and the dispatcher 126 coordinates the runtime execution of executable steps of the query execution plan of the optimizer module 120 with the access modules 110.

In one example, to facilitate implementations of automated adaptive query execution strategies, such as the examples described herein, the WM module 124 monitoring takes place by communicating with the dispatcher module 126 as it checks the query execution step responses from the access modules 110. The step responses include the actual cost information, which the dispatcher module 126 may then communicate to the WM module 124 which, in turn, compares the actual cost information with the estimated costs of the optimizer module 120.

During operation of the RDBMS 102, compression of database tables stored in the DSFs 112 may be performed. Various techniques may be used to compress data stored in database tables. One such being Golomb-Rice coding. Golomb-Rice coding is most often applied to arrays of integers such as integer columns within a database table. However, Golomb-Rice coding could be applied to any other data type where the symbols in an array such as a database column are of equal length. Columns that contain variable-length symbols are not suitable for Golomb-Rice coding. In such a fixed-length symbol array/column, each symbol N would be recoded using Golomb-Rice coding, often resulting in compression. The process of recoding involves representing the symbol N into two component parts Q and R. The following operations are used to determine the values of and R:

$$Q = \text{floor}(N/M)$$

$$R = N - Q*M$$

M is a tunable parameter that is determined using well known methods that calculate the optimal value of M given the entire array of symbols. The quotient Q is encoded using unary coding, and the remainder R is encoded using truncated binary encoding. The QR values for each symbol are concatenated into a string of binary codes. In a decompression step, a reverse transform is applied to the string of binary codes to re-create the original symbol column/array.

While Golomb-Rice coding provides valuable compression in most situations, in one example, the bit representation of values to be encoded may be rearranged to further maximize the compression ratio. In one example, a column 400 in a database table 402 may be selected for compression. Various manners of selection may be implemented, such as by data type (e.g., integers of 16 bits or more). Integers and other fixed-length symbol columns where the symbol alphabets are large are often suitable for Golomb-Rice compression. Columns containing variable length symbols or containing symbols with small alphabets (such as 8-bit text) are likely to be selected for compression using other techniques such as Lempel-Ziv compression.

Figure 4A:
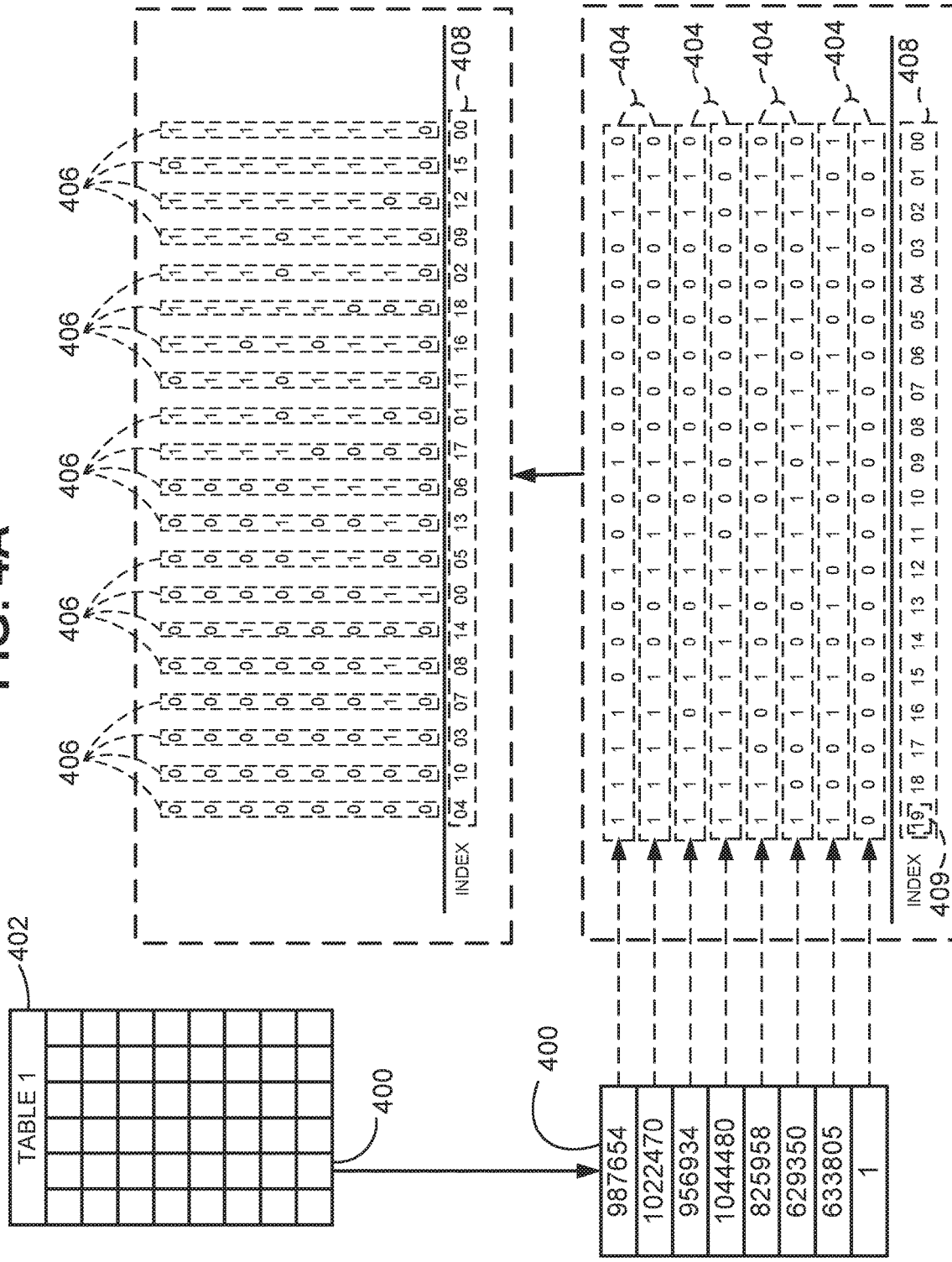
FIG. 4A is art example of an encoding technique in a database system.

In the example of FIG. 4A, column 400 of table 402 includes 8 rows of integers. In one example, the RDBMS 102 may determine a bit representation 404 of each row value in the column 400. An index 408 may be created having a number of ordered values with each index value 409 indexing a bit place 406. In one example, the lowest index value 409 may be "00" and associated with the lowest bit place 406 with the index value 409 increasing by one for each additional bit place 406. The total number of index values 409 may be based on the bit representation 404 having the highest leading "1" bit. Thus, for column values having a bit representation 404 with a leading "1" indexed lower than the highest index value, leading "0's" may be placed at a bit place 406 for each index value 409 greater than the respective leading "1" up to the highest index value. For example, all column values other than the last entry of column value "1" have bit representations 404 requiring twenty bits. The last column value of "1" requires nineteen leading zeroes so that each bit place 406 may be commonly indexed.

Once the bit representations 404 have been indexed, the bit places 406 may be reordered according to a particular pattern. In one example, the bit places 406 may be reordered according to reverse frequency of "1" bits, Thus, the bit place 406 having the greatest amount of "1" bits is first in ascending order. In the event that more than one bit place 406 has the same number of "1" bits, the bit places 406 may be placed in descending order according to the index value 409. In the example of FIG. 4A, six "1" bits are found at the bit places corresponding to index values "02", "05", "09", and "15". These index values 409 and associated bit places 406 are ordered in the descending order "15", "09", "05", and "02".

Figure 4B:
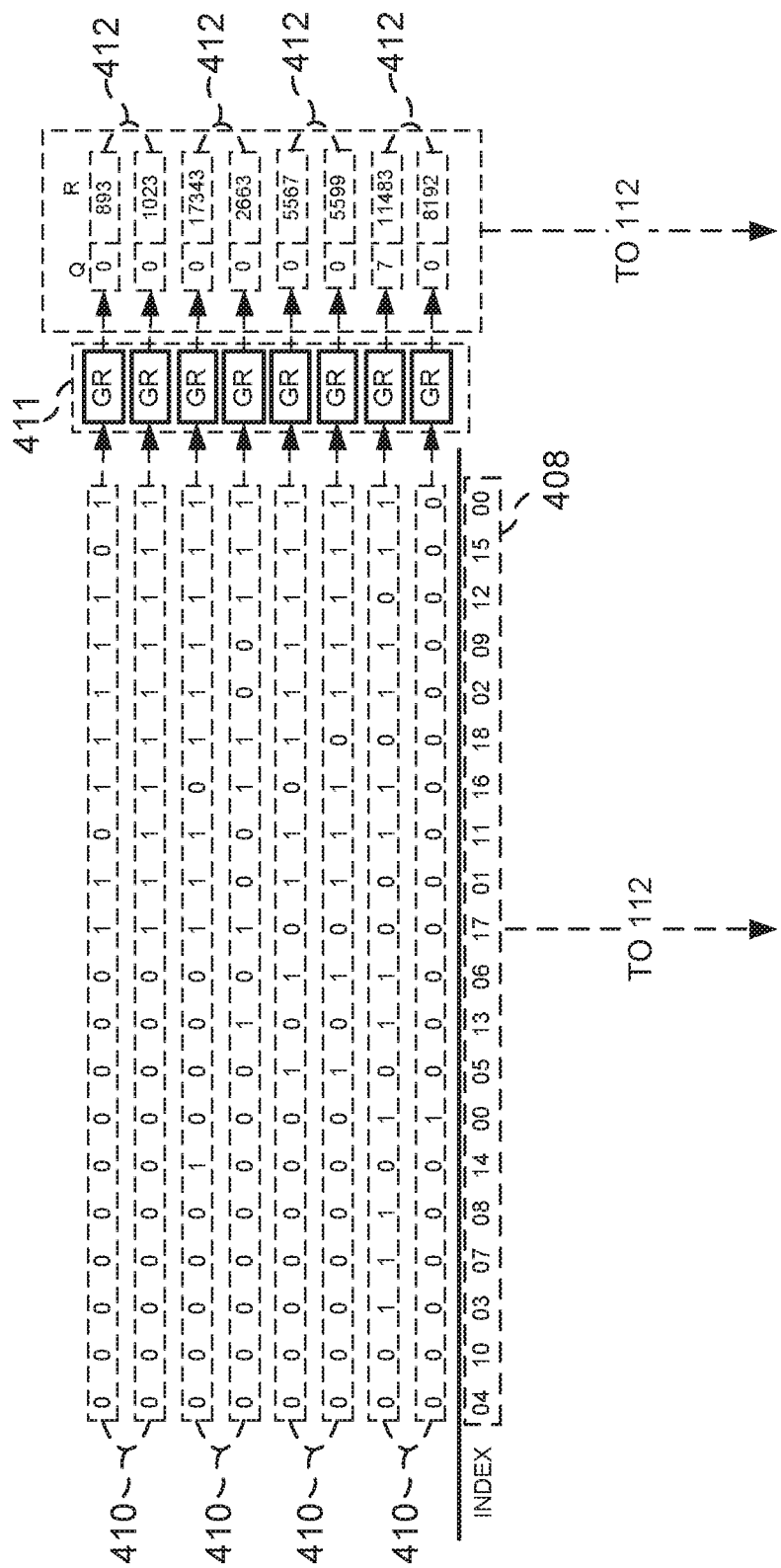
FIG. 4B is an example of an encoding technique in a database system.

Once the bit places 406 have been reordered for each index value 409, each reordered bit group 410 may be encoded as shown in FIG. 4B. In one example, Golomb-Rice ("GR") encoding 411 may be applied by the RDBMS 102 to values represented by each reordered bit group 410 to produce a respective encoded value 412. In one example, the RDBMS 102 may determine an optimal value for M, which may provide the best overall compression ratio for an encoded set of values. For example, applying Golomb-Rice encoding to column 400 and using a value of fifteen for M, reordering the bits initially requires ninety bits less for encoding. In one example, the index values 409 are also stored so that the original values in the column 400 may be restored after decoding. Maintaining these index values requires a bit cost of M*(log2(M)+1). The encoded values 412 and index values 409 may be stored to the DSFs 112.

As a comparison, the values of column 400, if encoded by Golomb-Rice coding, provide the encoded values shown in Table 1.

TABLE 1

| INTEGER | Q | R |
|---------|---|---|
| 0987654 | 111111111111110 | 0001001000000110 |
| 1022470 | 111111111111110 | 1001101000000110 |
| 0956934 | 111111111111110 | 1001101000000110 |
| 1044480 | 11111.11111111110 | 1111000000000000 |
| 0825958 | 111111111110 | 1001101001100110 |
| 0629350 | 111111111110 | 1001101001100110 |
| 0633805 | 111111111110 | 1010101111001101 |
| 0000001 | 0 | 0000000000000001 |

The total number of bits to encode all listed integers would be 225 bits. Applying Golomb-Rice encoding to the reordered bit groups 410 results in 135 bits, which is ninety bits less than the number of bits to encode values in column 400. The overhead cost of storing the index values 409 in this example requires sixty bits, which still results in a thirty-bit savings. In the example of FIGS. 4A-4B, using the reordered bit groups 410 provide an overall savings of thirty bits. As the size of each value to be encoded increases, the cost of the fixed overhead associated with the value of M diminishes as a percentage of the total compressed message. In the example of FIGS. 4A and 4B, there is a single outlier (value of 1 in column 400) that skews the value of M. This is where additional techniques, such as, RLE can be implemented. A lower value of M can be chosen that reduces the total number of R bits. The impact of the increased. Q bits on the outlier can be minimized by using well-known compression techniques such as run-length encoding (RLE), which allows additional compression to be used in long-repeated bit sequences.

Figure 5:
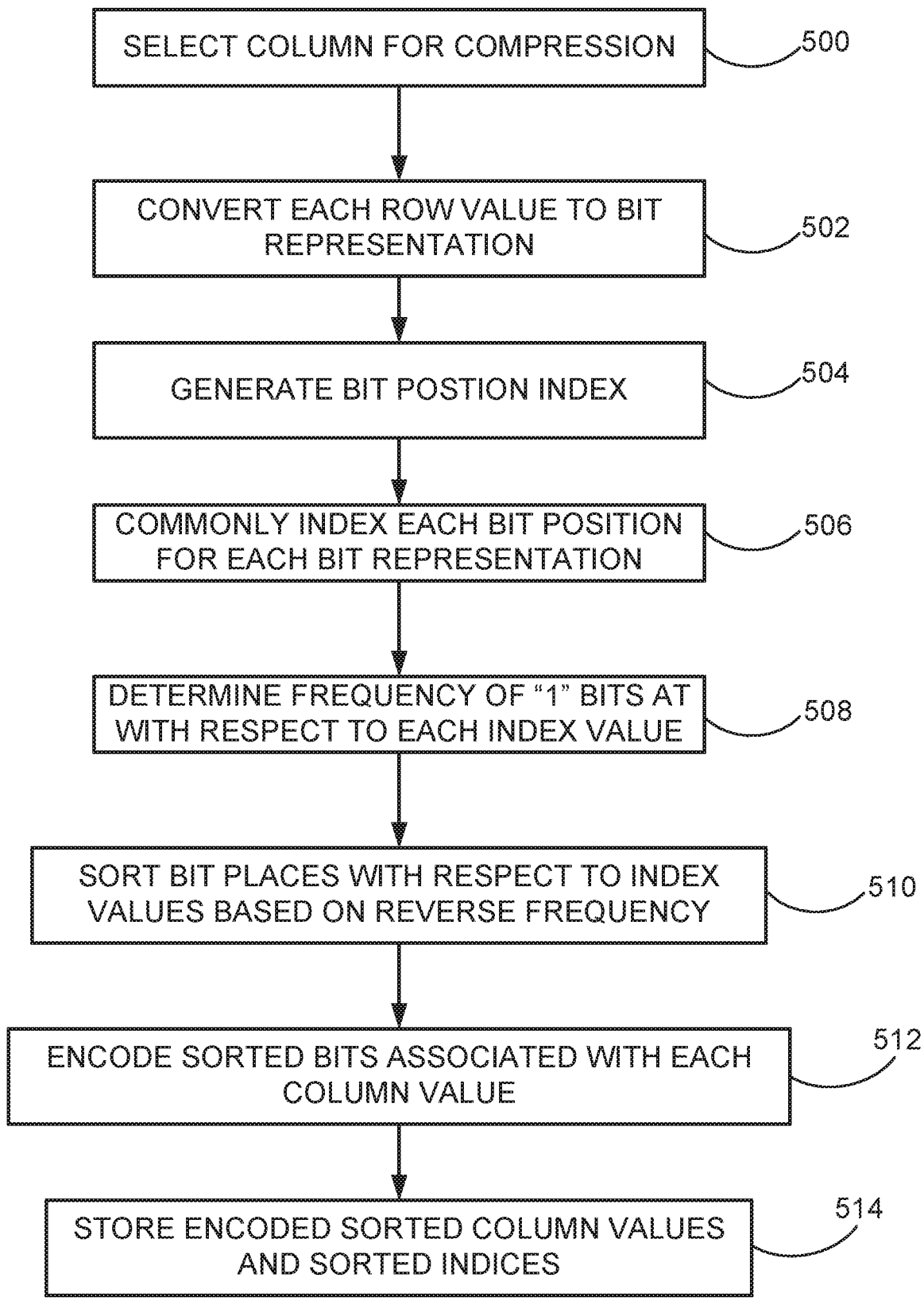
FIG. 5 is an operational flow diagram of a database system during execution of an encoding technique.

FIG. 5 is an operational flow diagram of the RDBMS 102 during example encoding. In one example, the RDBMS 102 may select a column of a database table, such as column 400 of database table 402 for encoding (500), The RDBMS 102 reads each value in the column 400 to determine each respective bit representation 404 (502). The RDMBS 102 may generate an index 408 (504). The index 408 may contain a number of index values 409. The RDBMS 102 may commonly index each bit place 406 for each bit representation 404 with an index value 409 (506). In one example, for bit representations 404 of values in the column 400 that have a leading one at a position lower than the bit representation 406 having the highest positioned leading one, leading zeroes may be used to fill any index position greater than the respective leading one up to the highest index value 409.

The RDBMS 102 may determine the frequency of "1" bits at each index value 409 (508). The RDBMS 102 may reorder the bits of the bit places 406 with respect to the index values 409 (510). In one example, the reordering may be based on descending order of the number of "1" bits at each bit place 406 for each index value 409. In the scenario in which the same number of "1" bits appear at more than a single bit position 406, the index values 409 will be in descending order according to the index value 409 of the index 408. Once the bit representations 404 have been reordered into the reordered bit groups 410, each reordered bit group 410 may be encoded (512). In one example, Golomb-Rice encoding may be applied to the reordered bit groups 410. The column values as encoded reordered bit groups 412 may be stored along with the reordered index values 409 (514), such as in the DSFs 112. In other examples, additional encoding/compression techniques may be applied prior to or after the Golomb-Rice encoding.

Figure 6:
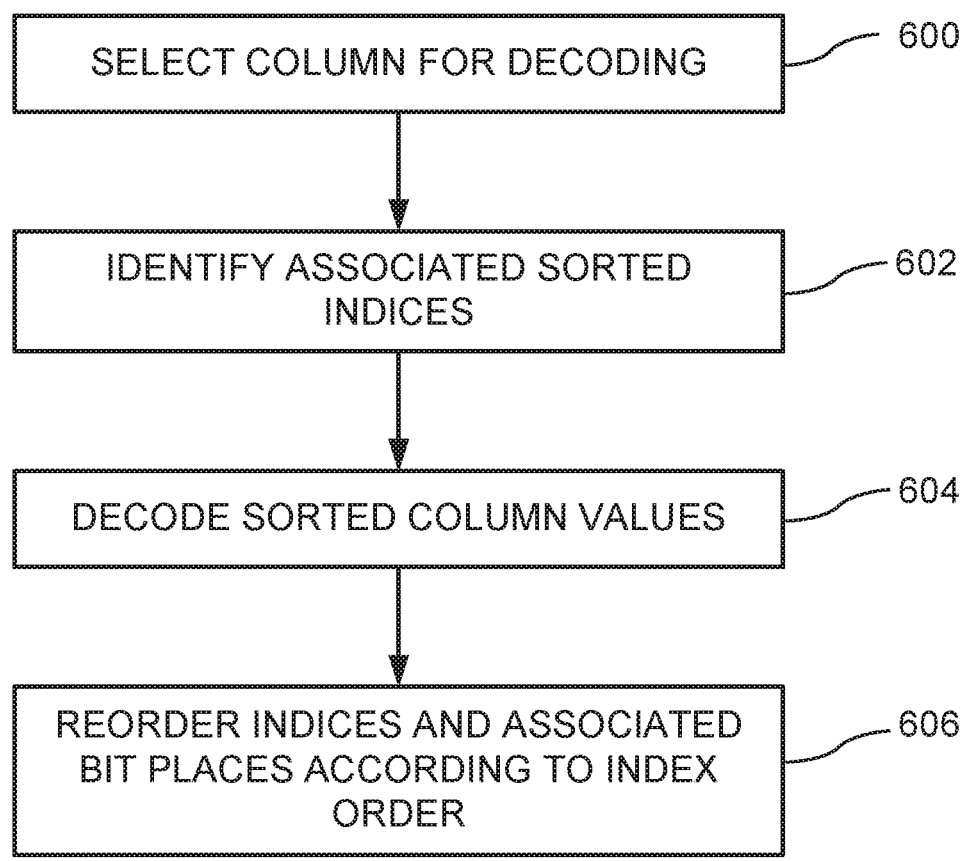
FIG. 6 is an operational flow diagram of a database system during execution of a decoding technique.

FIG. 6 is an operational flow diagram of the RDBMS 102 during example decoding of values that have been encoded using Golomb-Rice encoding of reordered table column values. In one example, a column may be selected for decoding (600), such as encoded column 402. The RDBMS 102 may identify an associated reordered index 408 (602). The RDBMS 102 may decode the reordered column values of the column 400 (604), which, in one example, may be Golomb-Rice encoded. The RDBMS 102 may reorder the index values 409 and the associated bits according to index value order (606), which restores the decoded column values.

The examples herein have been provided with the context of a relational database system. However, all examples are applicable to various types of data stores, such as file systems or other data stores suitable for organization and processing of data. While various embodiments of the invention have been described, it will be apparent to those of ordinary skill in the art that many more embodiments and implementations are possible within the scope of the invention.

Accordingly, the invention is not to be restricted except in light of the attached claims and their equivalents.

I claim:

1. A data store system comprising:
a storage device configured to store a plurality of data store tables;
a processor in communication with the storage device, the processor configured to:
receive a request to encode a column of a data store table from the plurality of data store tables;
generate a bit value representation of each value in the column of the data store table;
generate an index, wherein the index comprises an index value representative of each bit position of the bit value representations;
reorder bits of each bit value representation according to a predetermined pattern;
encode each reordered bit value representation according to an encoding technique; and
store each encoded reordered bit value representations and the index.

2. The data store system of claim 1, wherein the processor is further configured to:
determine a frequency of "1" bits at each index value; and
reorder the bits of each bit value representation based on the determined frequencies.

3. The data store system of claim 1, wherein the processor is further configured to reorder the bits of each bit value representation in descending order of a frequency of a number of "1" bits at each index value position.

4. The data store system of claim 1, wherein the processor is further configured to:
determine which bit value representation has a highest leading "1" bit relative to other bit value representations; and
generate, for each other bit value representation, a "0" bit at a bit position associated with an index value that is greater than a respective leading "1" bit of the bit value representation.

5. The data store system of claim 1, wherein the processor is further configured to encode each reordered bit value using Golomb-Rice encoding.

6. The data store system of claim 5, wherein the processor is further configured to apply run length encoding to at least one encoded reordered bit value.

7. The data store system of claim 1, wherein the processor is further configured to decode each encoded reordered bit value representation.

8. A method comprising:
receiving, with a processor, a request to encode a column of a data store table from a plurality of data store tables stored in a storage device;
generating, with the processor, a bit value representation of each value in the column of the data store table;
generating, with the processor, an index, wherein the index comprises an index value representative of each bit position of the bit value representations;
reordering, with the processor, bits of each bit value representation according to a predetermined pattern;
encoding, with the processor, each reordered bit value representation according to an encoding technique; and
storing, with the processor, each encoded reordered bit value representations and the index.

9. The method of claim 8, further comprising:
determining, with the processor, a frequency of "1" bits at each index value; and
reordering, with the processor, the bits of each bit value representation based on the determined frequencies.

10. The method of claim 9, further comprising reordering, with the processor, the bits of each bit value representation in descending order of a frequency of a number of "1" bits at each index value position.

11. The method of claim 8, further comprising:
determining, with the processor, which bit value representation has a highest leading "1" bit relative to other bit value representations; and
generating, with the processor, for each other bit value representation, a "0" bit at a bit position associated with an index value that is greater than a respective leading "1" bit of the bit value representation.

12. The method of claim 8, further comprising encoding, with the processor, each reordered bit value using Golomb-Rice encoding.

13. The method of claim 12, further comprising applying, with the processor, run length encoding to at least one encoded reordered bit value.

14. The method of claim 8, further comprising decoding, with the processor, each encoded reordered bit value representation.

15. A computer-readable medium encoded with a plurality of instructions executable by a processor, the plurality of instructions comprising:
instructions to receive a request to encode a column of a data store table from a plurality of data store tables stored in a storage device;
instructions to generate a bit value representation of each value in the column of the data store table;
instructions to generate an index, wherein the index comprises an index value representative of each bit position of the bit value representations;
instructions to reorder bits of each bit value representation according to a predetermined pattern;
instructions to encode each reordered bit value representation according to an encoding technique; and
instructions to store each encoded reordered bit value representations and the index.

16. The computer-readable medium of claim 15, wherein the plurality of instructions further comprises:
instructions to determine a frequency of "1" bits at each index value; and
instructions to reorder the bits of each bit value representation based on the determined frequencies.

17. The computer-readable medium of claim 16, wherein the plurality of instructions further comprises instructions to reorder the bits of each bit value representation in descending order of a frequency of a number of "1" bits at each index value position.

18. The computer-readable medium of claim 15, wherein the plurality of instructions further comprises:
   instructions to determine which bit value representation has a highest leading "1" bit relative to other bit value representations; and
   instructions to generate for each other bit value representation, a "0" bit at a bit position associated with an index value that is greater than a respective leading "1" bit of the bit value representation.

19. The computer-readable medium of claim 15, wherein the plurality of instructions further comprises instructions to encode each reordered bit value using Golomb-Rice encoding.

20. The computer-readable medium of claim 19, wherein the plurality of instructions further comprises instructions to apply run length encoding to at least one encoded reordered bit value.

* * * * *